(12) United States Patent
Hunt et al.

(10) Patent No.: US 6,803,840 B2
(45) Date of Patent: Oct. 12, 2004

(54) PATTERN-ALIGNED CARBON NANOTUBE GROWTH AND TUNABLE RESONATOR APPARATUS

(75) Inventors: Brian D. Hunt, La Cresenta, CA (US); Flavio Noca, Altadena, CA (US); Michael E. Hoenk, Valencia, CA (US); Larry Epp, Pasadena, CA (US); Daniel J. Hoppe, La Cañada, CA (US); Robert S. Kowalcyk, Santa Clarita, CA (US); Daniel S. Choi, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 69 days.

(21) Appl. No.: 10/113,247

(22) Filed: Apr. 1, 2002

(65) Prior Publication Data

US 2002/0167374 A1 Nov. 14, 2002

Related U.S. Application Data

(60) Provisional application No. 60/280,579, filed on Mar. 30, 2001, and provisional application No. 60/280,591, filed on Mar. 30, 2001.

(51) Int. Cl.[7] .............................. H03H 9/24; H03H 9/46; D01F 9/12
(52) U.S. Cl. .................... 333/186; 333/197; 423/447.3; 310/36; 310/37; 205/766; 205/768
(58) Field of Search ................................. 333/186, 197; 423/447.3; 310/36, 37; 205/766, 768

(56) References Cited

U.S. PATENT DOCUMENTS

| | | | |
|---|---|---|---|
| 5,110,339 A | | 5/1992 | Ciriello et al. ................. 65/238 |
| 5,617,020 A | * | 4/1997 | Campbell et al. ............ 324/142 |
| 5,837,115 A | | 11/1998 | Austin et al. ................ 204/450 |
| 6,346,189 B1 | * | 2/2002 | Dai et al. ..................... 205/766 |
| 6,399,406 B2 | * | 6/2002 | Chan et al. ..................... 438/28 |
| 6,401,526 B1 | * | 6/2002 | Dai et al. ....................... 73/105 |

OTHER PUBLICATIONS

International Search Report dated Jul. 11, 2002 for corresponding International Application No. PCT/US02/10202, 4 pgs.

Avrutsky, Ivan A. et al.; *Multiwavelength Diffraction and Apodization Using Binary Superimposed Gratings*; IEEE Photonics Technology Letters; vol. 10, No. 6, Jun. 1998; pp. 839–841.

Baughman, Ray H. et al.; *Carbon Nanotube Acturators*; Science; vol. 284; May 21, 1999; pp. 1340–1344.

Boul, P.J. et al.; *Reversible sidewall functionalization of buckytubes*; Chemical Physics Letters; vol. 310; Sep. 3, 1999; pp. 367–372.

Chen, Yan et al.; *Plasma–induce low–temperature growth of graphitic nanofibers on nickel substrates:* Journal of Crystal Growth: vol. 193; Jun. 5, 1998; pp. 342–346.

(List continued on next page.)

*Primary Examiner*—Barbara Summons
(74) *Attorney, Agent, or Firm*—Christie, Parker & Hale, LLP

(57) ABSTRACT

A tunable nanomechanical oscillator device and system is provided. The nanomechanical oscillator device comprising at least one nanoresonator, such as a suspended nanotube, designed such that injecting charge density into the tube (e.g. by applying a capacitively-cuopled voltage bias) changes the resonant frequency of the nanotube, and where exposing the resonator to an RF bias induces oscillitory movement in the suspended portion of the nanotube, forming a nanoscale resonator, as well as a force sensor when operated in an inverse mode. A method of producing an oriented nanoscale resonator structure with integrated electrodes is also provided.

41 Claims, 11 Drawing Sheets

OTHER PUBLICATIONS

Choi, Young Chul et al.; *Growth of carbon nanobutes by microwave plasma–enhanced chemical vapor deposition at low temperature;* J. Vac. Sci. Technol., American Vacuum Society: vol. 18, No. 4; Jul./Aug. 2000: pp. 1861–1868.

Chou, Hou–Pu et al.; *A microfabricated device for sizing and sorting DNA molecules:* Proc. Natl. Acad. Sci. USA, Applied Physical Sciences, Biophysics; vol. 96; Jan. 1999; pp. 11–13.

Dial, O. et al.; *Fabrication of high–density nanostructures by electron beam lithography;* J. Vac. Sci. Technol.; vol. 16, No. 6; Nov./Dec. 1998; pp. 3887–3890.

Drmanac, R. et al.; *Sequencing by Hybridization;* Adams M.D. et al. "Automated DNA sequencing and analysis" Academic Press; pp. 29–36, copyright 1994.

Duke, Thomas A. et al.; *Pulsed–field electrophoresis in microlithographic arrays;* Electrophoresis; vol. 17, 1996; pp. 1075–1079.

Duke, Thomas et al.; *Sequencing in nanofabricated arrays: A feasibility study;* Electrophoresis; 1997; vol. 18, pp. 17–22.

Fan, Shoushan et al.; *Self–Oriented Regular Arrays of Carbon Naotubes and Their Field Emission Properties;* Science; vol. 283; Jan. 22, 1999; pp. 512–514.

Hadd, Andrew G. et al.; *Sub–microliter DNA sequencing for capillary array electrophoresis;* Journal of Chromatogaphy A; vol. 894; 2000; pp. 191–201.

Hafner, Jason H. et al.; *Direct Growth of Single–Walled Carbon Nanotube Scanning Probe Microscopy Tips;* J. Am. Chem. Soc., The American Chemical Society: vol. 121; 1999; pp. 9750–9751.

Han, J. et al.; *Entropic Trapping and Escape of Long DNA Molecules at Submicron Size Cosntriction:* Physical Review Letters, The American Physical Society; vol. 83, No. 8; Aug. 23, 1999; pp. 1688–1691.

Han, Jie et al.; *Observation and modeling of single–wall carbon nanotube bend junctions:* Physical Review B, The American Physical Society; vol. 57, No. 23; Jun. 15, 1998: pp. 983–989.

Han, Young–Soo et al.; *Synthesis of carbon nanotube bridges on patterned silicon wafers by slective lateral growth;* Journal of Applied Physics, American Insitute of Physics; vol. 90, No. 11; Dec. 1, 2001; pp. 5731–5734.

Huang, Z.P. et al.; *Growth of highly oriented carbon nanotubes by plasma–enhanced hot filament chemical vapor deposition:* Applied Physics Letters, American Institute of Physics; vol. 73, No. 26; Dec. 28, 1998; pp. 3845–3847.

Hutt, Lester D. et al.; *Microfabricated Capillary Electrophoresis Amino Acid Chirality Analyzer for Extraterrestrial Exploration;* Analytical Chemistry; vol. 71, No. 18; Sep. 15, 1999; pp. 4000–4006.

Ilic, B. et al.; *Mechanical resonant immunospecific biological detector;* Applied Physics Letters, American Institute of Physics; vol. 77, No. 3; Jul. 17, 2000; pp. 450–452.

Ju, Jingyue et al.; *Energy transfer primers: A new fluroescence labeling paradigm for DNA sequencing and analysis;* Nature Medicine; vol. 2, No. 2; Feb. 1996; pp. 246–249.

Kelly, Ross T.; *Unidirectional rotary motion in a molecular system;* Nature; vol. 401; Sep. 9, 1999; pp. 150–152.

Kim, Philip et al.; *Nanotube Nanotweezers:* Science; vol. 286; Dec. 10, 1999; pp. 2148–2150.

Korgel, Brian A. et al.; *Self–Assembly of Silver Nanocrystals into Two–Dimensional Nanowire Arrays;* Advanced Materials; vol. 10, No. 9; 1998; pp. 661–665.

Koumura, Nagatoshi et al.; *Light–driven monodirectional molecular rotor;* Nature, vol. 401; Sep. 9, 1999: pp. 152–155.

Lee, Cheol Lin et al.; *Low–Temperature growth of carbon nanotubes by thermal chemical vapor deposition using Pd, Cr, and Pt as co–catalyst;* Chemical Physics Letters; vol. 327; Sep. 15, 2000; pp. 277–283.

Li, Y.J. et al.; *Carbon nanotube films prepared by thermal chemical vapor deposition at low temperture for field emission applications;* Applied Physics Letters, American Institute of Physics; vol. 79, No. 11; Sep. 10, 2001; pp. 1670–1672.

Li, J. et al.; *Highly–ordered carbon nanotube arrays for electronics applications;* Applied Physics Letters, American Institute of Physics; vol. 75, No. 3; Jul. 19, 1999; pp. 367–369.

Liu, Q. et al.; *Detection of Virtually All Mutations–SSCP (DOVAM–S): A Rapid Method for Mutation Scanning with Virtually 100 Sensitivity;* BioTechniques; vol. 26, No. 5; May 1999; pp. 932–942.

Masuda, Hideki et al.; *Highly ordered nanochannel–array architecture in anodic alumina;* Appl. Phys. Lett., American Institute of Physics; vol. 71, No. 19; Nov. 10, 1997; pp. 2770–2772.

Merkulov, V.I. et al.; *Patterned growth of individual and multiple vertically aligned carbon nanofibers;* Applied Physics Letters, American Insitute of Physics; vol. 76, No. 24; Jun. 12, 2000, pp. 3555–3557.

Murakami, Hirohiko et al.; *Field emission from well–aligned, patterned, carbon nanotube emitters;* Applied Physics Letters, American Institute of Physics; vol. 76, No. 13; Mar. 27, 2000; pp. 1776–1778.

Nakamura, S.; *InGaN–based violet laser diodes;* Semicond Sci. Technol.; vol. 14; 1999; pp. R27–R40.

Öttinger, Hans Christian; *A thermodynamically admissible reptation model for fast flows of entangled polymers;* The Society of Rheology, Inc.; J. Rheol; vol. 43, No. 6; Nov./Dec. 1999; pp. 1461–1493.

Poncharal, Philippe et al.; *Electrostatic Deflections and Electromechanical Resonances of Carbon Nanotubes;* Science; vol. 283: Mar. 5, 1999; pp. 1513–1516.

Ren, Z.F. et al., *Growth of a single freestanging multiwall carbon nanotube on each nanonickel dot;* Applied Physics Letters, American Institute of Physics; vol. 75, No. 8, Aug. 23, 1999; pp. 1086–1088.

Reulet, B. et al.; *Acoustoelectric Effects in Carbon Nanotubes;* Physical Review Letters, the American Physical Society; vol. 58, No. 13, Sep. 25, 2000; pp. 2829–2832.

Roukes, M.L.; *Nanoelectromechanical Systems;* Technical Digest of the 2000 Solid–State Sensor and Actuator Workshop; pp. 1–10.

Routkevitch, Dmitri et al.; *Nonlithographic Nano–Wire Arrays: Fabrication, Physics, and Device Applications;* IEEE Transactions of Electron Devices; vol. 43, No. 10; Oct. 10, 1996; pp. 1646–1658.

Schmalzing, Dieter et al.; *Toward Real–World Sequencing by Microdevice Electrophoresis;* Genome Research; vol. 9; pp. 853–858, Jul., 1999.

Soper, Steven A.; *Nanoliter–scale sample preparation methods directly coupled to polymethylmethacrylate–based microchips and gel–filled capillaries for the analysis of oligonucleotides;* Journal of Chromatography A; vol. 853; 1999; pp. 107–120.

Turner, S.W. et al.; *Monolithic nanofluid sieving structures for DNA manipulation;* J. Vac. Sci. Technol., American Vacuum Society; vol. 16, No. 6; Nov./Dec. 1998; pp. 3835–3840.

Van Der Gaag, B.P. et al.; *Microfabrication below 10nm;* Appl. Phys. Lett, American Institute of Physics; vol. 56, No. 5; Jan. 29, 1990; pp. 481–483.

Volkmuth, W.D. et al.; *DNA Electrodiffusion in a 2D Array of Posts;* Physical Review Letters, The American Physical Society; vol. 72, No. 13; Mar. 28, 1994; pp. 2117–2120.

Volkmuth, W.D. et al.; *DNA electrophoresis in microlithographic arrays;* Nature; vol. 358; Aug. 13, 1992; pp. 600–602.

Westermeier, Reiner; *Electrophoresis in Practice, A Guide to Method and Applications of DNA and Protein Separations, Chapter 1—Electrophoresis;* Second Edition; VCH. A Wiley company; 1997; pp. 6–39.

Wildoer, Jeroen W.G. et al.; *Electronic structure of atomically resolved carbon nanotubes;* Nature; vol. 391; Jan. 1, 1998; pp. 59–62.

Xu, Yan; Capillary Electrophoresis; Analytical Chemistry, American Chemical Society; vol. 71, No. 12; Jun. 15, 1999; pp. 309R–313R.

Yoon, DY et al.; *Comparison of chain conformations for ploystyrene and model molecules in the gas phase, solvents and melts from MD simulations;* Abstracts of Papers, Part 2: $215^{th}$ ACS National Meeting; American Chemical Society; Mar. 29–Apr. 2, 1998; 1 p.

Yu, Min–Feng et al.; *Tensile Loading of Ropes of Single Wall Carbon Nanotubes and their Mechanical Properties;* Physical Review Letters, The American Physical Society; vol. 84, No. 24; Jun. 12, 2000; pp. 5552–5555.

Zhang, Y. et al.; *Elastic Response of Carbon Nanotube Bundles to Visible Light;* Physical Review Letters, The American Physical Society; vol. 82, No. 17; Apr. 26, 1999; pp. 3472–3475.

Zhang, Yuegang et al.; *Electric–field–directed growth of aligned single–walled carbon nanotubes;* Applied Physics Letters, American Institute of Physics; vol. 79, No. 19; Nov. 5, 2001; pp. 3155–3157.

Zhang, Y et al.; *Formation of single–wall carbon nanotubes by laser ablation of fullerenes at low temperature;* Applied Physics Letters, American Institute of Physics; vol. 75, No. 20; Nov. 15, 1999; pp. 3087–3089.

\* cited by examiner

PATTERN-ALIGNED CARBON NANOTUBE GROWTH AND TUNABLE RESONATOR APPARATUS

CROSS-REFERENCE TO RELATED APPLICATION

This application is based on U.S. Application Nos. 60/280,579, filed Mar. 30, 2001 and 60/280,591, filed Mar. 30, 2001 the disclosures of which are incorporated herein by reference.

STATEMENT REGARDING FEDERALLY SPONSORED RESEARCH

The U.S. Government has certain rights in this invention pursuant to grant No. NAS 7-1407, awarded by the National Aeronautics and Space Administration, Office of Space Science.

FIELD OF THE INVENTION

The present invention is directed to the controlled growth of nanotubes, and more particularly to the pattern-aligned growth of carbon nanotubes for use as tunable high-Q resonators.

BACKGROUND OF THE INVENTION

Nanoscale structures are becoming increasingly important because they provide the basis for devices with dramatically reduced power and mass, while simultaneously having enhanced capabilities.

For example, mechanical resonators have been of significant interest because such resonators can exhibit orders of magnitude higher quality factors (Q) than electronic resonators. Such low-loss resonators are important for communications and mechanical signal processing applications. However, practical mechanical resonators have typically used bulk acoustic wave (BAW) oscillators, such as quartz crystals; or surface acoustic wave (SAW) oscillators. These bulk-crystal-based oscillators tend to be bulky and difficult to inexpensively integrate with high frequency electronic circuits. As a result, there has been a move towards Si-micromachined resonators, which can be monolithically integrated with conventional electronics. However, to date Si-based resonators have not been demonstrated at frequencies over 400 MHz, they suffer from reduced quality factors at higher frequencies, and they have limited tuning ranges. In addition, it appears that practical transduction mechanisms for the readout of Si resonators will be problematic for Si oscillators operating at or near the GHz frequency regime. Finally, data suggests that Si resonators will have a small dynamic range.

In contrast, nanoscale mechanical structures hold the potential to enable the fabrication of high-quality-factor (Q) mechanical resonators with high mechanical responsivity over a wide dynamic range. Such devices can form very low-loss, low-phase-noise oscillators for filters, local oscillators, and other signal processing applications. High-Q resonators are critical components in communications and radar systems, as well as in MEMS-based sensors such as a micro-gyroscope. The combination of high-Q with small force constants enabled by nanoscale resonators would also produce oscillators with exceptional force sensitivity. This sensitivity is important for a variety of force-detection-based sensors and may ultimately allow single molecule spectroscopy by NMR and optical techniques. (M. L. Roukes, Solid-State Sensor and Actuator Workshop Proceedings, Hilton Head, S.C., Jun. 4–8, 2000, p. 367.) Such mechanical oscillators are also key components for mechanical signal processing, which is of great interest because small-scale, high-Q mechanical elements may theoretically enable processing at GHz rates with orders-of-magnitude lower power dissipation than conventional CMOS processors.

Despite the potential for these nanomechanical devices, the practical application of nanotube-based actuators and oscillators has been limited by the development of growth and processing methods for the control of nanotube placement and orientation. These techniques are critical for a wide variety of other nanotube applications including nanotube electronic systems.

One novel approach to making nanometer-scale structures utilizes self-assembly of atoms and molecules to build up functional structures. In self-assembled processing, atom positions are determined by fundamental physical constraints such as bond lengths and angles, as well as atom-to-atom interactions with other atoms in the vicinity of the site being occupied. Essentially, self-assembly uses the principles of synthetic chemistry and biology to grow complex structures from a set of basic feedstocks. Utilizing such techniques molecular motors have been synthetically produced containing fewer than 80 atoms. Chemical vapor deposition (CVD) appears to be the most suitable method for nanotube production for sensor and electronic applications. CVD uses a carbon-containing gas such as methane, which is decomposed at a hot substrate surface (typically 600–900C) coated with a thin catalyst film such as Ni or Co. However, most studies to date have produced disordered nanotube films.

A notable exception is the work of Prof. Xu of Brown University who has developed a new technique for producing geometrically regular nanotube arrays with excellent uniformity in nanopore templates. Xu et al. *Appl. Phys. Lett.*, 75, 367 (1999), incorporated herein by reference. Post-patterning of these ordered arrays could be used to selectively remove tubes in certain areas or produce regions with different length tubes. A variety of other studies have shown that dense, but locally disordered arrays of normally-oriented nanotubes can be selectively grown on pre-patterned catalyst layers.

In addition, there has been little progress in the control of nanotube orientation in the plane parallel to the substrate surface. Many of the basic electrical measurements of nanotubes have been done using electrodes placed on randomly scattered tubes after growth, or by physically manipulating tubes into place with an atomic force microscope (AFM). Dai and co-workers have been able to demonstrate random in-plane growth between closely spaced catalyst pads, including growth over trenches, as well as a related technique to produce nanotubes suspended between Si posts. Dai. Et al., *Science,* 283, 512 (1999), incorporated herein by reference. In these cases individual nanotubes sometimes contact adjacent electrodes by chance, and excess tubes can be removed with an AFM tip. This type of procedure can be effective for simple electrical measurements, but considerable improvements will be required for production of more complex nanotube circuits. Smalley's group has demonstrated a wet chemistry-based method of control over nanotube placement using solution deposition on chemically functionalized substrates, although questions remain about nanotube length control and contact resistance. Smalley et al., *Nature,* 391, 59 (1998), incorporated herein by reference. More recently, Han and co-workers have demonstrated a process for lateral growth of nanotubes between two electrodes, but with uncontrolled nanotube location and orientation in the plane of the substrate (Han et al., Journal of Applied Physics 90, 5731 (2001)). None of the current techniques have been able to grow vertical individual nanotubes or small groups of nanotubes in controlled locations with integrated electrodes, as would be necessary to form nanotube oscillators or actuators.

In addition to the problems associated with controlled growth and orientation of nanotubes, nanotube actuators and oscillators also require a transduction mechanism to convert input signals to physical motion and to provide corresponding output signals.

One possible electromechanical transduction mechanism is suggested by a recent demonstration that nanotube mats can serve as very high efficiency electromechanical actuators in an electrolyte solution, with the possibility of even better results for well-ordered single wall tubes. Baughman et al., Science, 284 1340 (1999), incorporated herein by reference. In brief, Baughman found that electronic charge injection into nanotubes results in a change in the length of the nanotubes. Conversely, it is expected that changing the length of a nanotube through an externally-applied force will result in the movement of charge on or off the tube, depending on whether the tube is stretched or compressed. However, this technique has only been demonstrated for large disordered arrays of nanotubes, no technique has been developed for the controlled motion of individual nanotube resonators. Other potential actuation mechanisms include light-induced nanotube motion, which has been observed, and magnetomotive actuation (M. L. Roukes, Solid-State Sensor and Actuator Workshop Proceedings, Hilton Head, S.C., Jun. 4–8, 2000, p. 367.). However, it is expected that light coupling to nanoscale-cross-section nanotubes will be inefficient, and magnetomotive actuation requires extremely high magnetic fields.

Finally, there has been one report of high frequency resonator measurements on carbon nanotube bundles suspended over a trench in which Qs of around 1000 at 2 GHz were observed. However, the carbon bundle resonator required superconducting electrodes and low temperature measurement.

There have also been a number of papers on using mechanical resonators as mass detectors via measurement of mass-induced resonant frequency shifts ("Mechanical resonant immunospecific biological detector", B. Ilic, D. Czaplewski, H. G. Craighead, P. Neuzil, C. Campagnolo, and C. Batt, Appl. Phys. Lett. 77, 450 (2000); K. L. Ekinci, X. M. H. Huang, and M. L. Roukes, "Ultrasensitive Nanoelectromechanical Mass Detection", preprint Jun. 6, 2001 submitted to Science). Roukes and co-workers even predict an ultimate mass sensitivity with nanomechanical resonators approaching a single Dalton, the mass of a hydrogen atom. However, to our knowledge, there have been no demonstrations of single molecule sensing using mechanical resonators.

Accordingly, a need exists to develop nanoscale mechanical devices, such as, resonators to enable real-world applications ranging from molecular-scale characterization to ultra-low-loss mechanical filters and local oscillators for communications and radar, to rad-hard low-power mechanical signal processors.

SUMMARY OF THE INVENTION

The present invention is directed to a tunable nanomechanical resonator system comprising at least one suspended nanofeature, such as a nanotube, where the nanofeature is in signal communication with means for inducing a difference in charge density in the nanofeature (e.g. by applying a capacitively-coupled voltage bias) such that the resonant frequency of the nanofeature can be tuned by changing the tension across the nanofeature, and where the nanofeature is in signal communication with an RF bias such that resonant movement can be induced in the suspended portion of the nanofeature, forming a nanoscale resonator, as well as a force sensor when operated in an inverse mode. The invention is also directed to growth techniques capable of producing a suspended nanofeature structure controllably positioned and oriented with integrated electrodes.

In one embodiment, this invention utilizes a suspended nanotube with integrated electrodes on a substrate that functions as an electromechanical resonator. This invention is also directed to a device, which utilizes a suspended nanotube with integrated electrodes on a substrate that functions as a molecular sensor or a frequency spectrum analyzer. This invention is also directed to novel systems and methods for utilizing devices comprising at least one suspended nanotube with integrated electrodes on a substrate.

In another alternative embodiment, the mechanical oscillation is produced by optical irradiation or capacative coupling.

In still another embodiment, the invention is directed to suspended nanotube oscillators or resonators. The suspended nanotube oscillators may be utilized as high-Q mechanical resonators for filters, signal processing, and sensors. In such an embodiment, excitation and readout of a nanotube oscillator may be made using any suitable methods, including: charge injection, light, or electrostatic.

In still yet another embodiment, the invention is directed to a system for the detection of substances or signal frequencies comprising multiple detectors as described above, such that parallel processing of molecules or signals can be carried out.

In still yet another embodiment, the invention is directed to growth and processing techniques to control resonator location and orientation; and methods for positioning nanotubes during growth, including nanoscale patterning of the substrate to ensure that the growth of the nanotubes is located and aligned with the integrated electrodes.

In still yet another embodiment the nanotubes comprising the resonators are self-assembled into resonators having a specified diameter and height suitable for use in the devices of the current invention.

In still yet another embodiment, the substrate is made of a semiconductor such as, for example, oxidized silicon or aluminum oxide, coated with a metal catalyst film such as, for example, Ni or Co. In this embodiment, the silicon can be further doped to adjust the electronic properties of the substrate surface.

In still yet another embodiment, the nanotubes comprising the resonators are self-assembled from an inert material such as, for example, carbon utilizing a carbon feedstock gas such as, for example, ethylene.

BRIEF DESCRIPTION OF THE DRAWINGS

These and other features and advantages of the present invention will be better understood by reference to the following detailed description when considered in conjunction with the accompanying drawings wherein.

DETAILED DESCRIPTION OF THE INVENTION

The present invention is directed to a tunable nanoscale resonator device and system comprising at least one suspended nanofeature, such as a nanotube, and means for inducing a charge in the tube (e.g. by biasing the tube via a capacitively coupled voltage bias) such that the resonant frequency of the nanoresonator can be tuned via the charge-driven length change of the nanofeature, and RF generating means for inducing a resonance in the nanotube, forming a nanoscale resonator, as well as a force sensor when operated in an inverse mode. These devices will be collectively referred to as nanoresonators herein.

Figure 1:
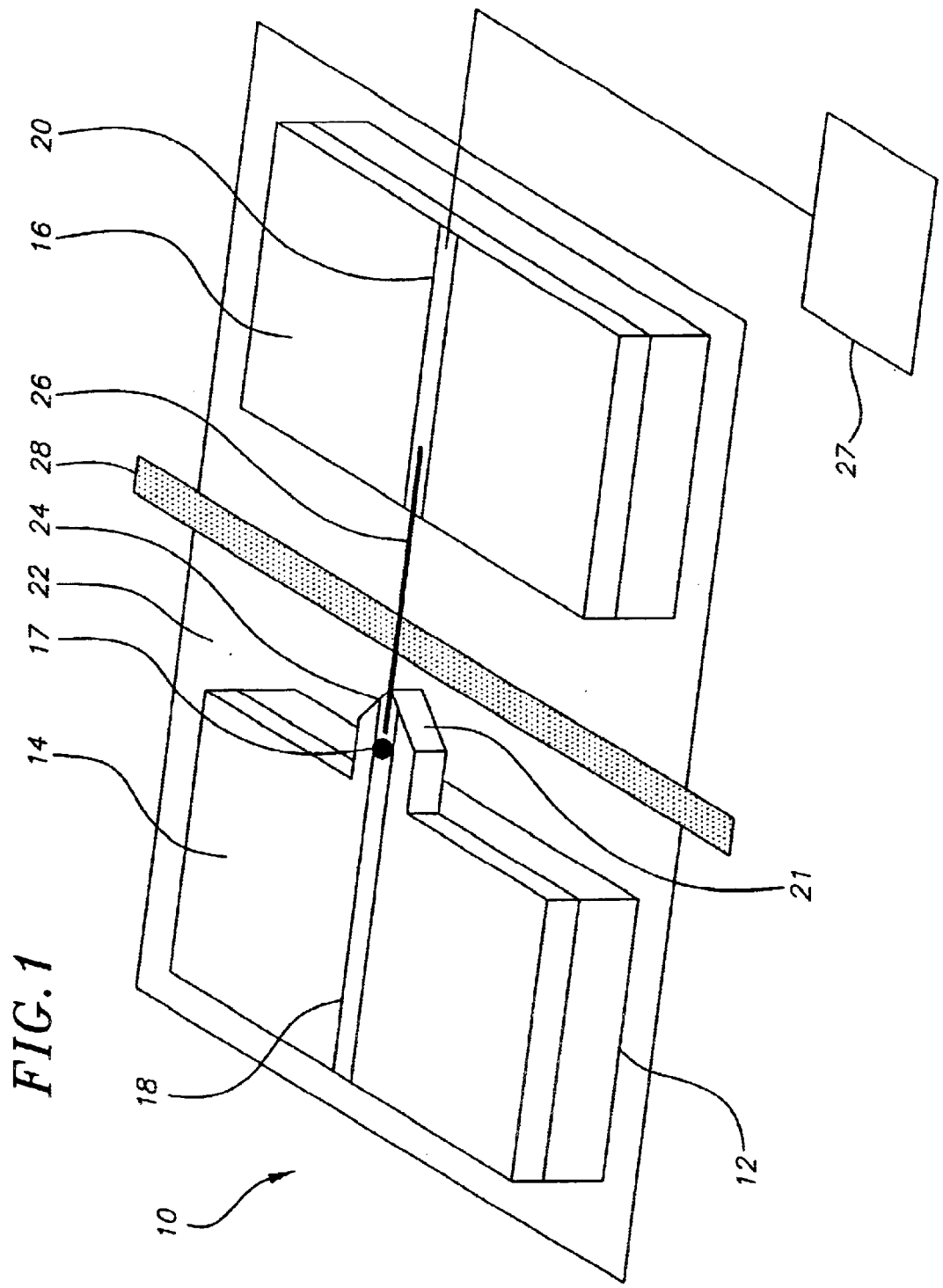
FIG. 1 is a schematic view of an embodiment of a suspended nanotube resonator according to the invention.

As shown in FIG. 1, in one embodiment the nanoresonator device 10 according to the invention generally comprises a substrate 12, having first 14 and second 16 supports, a growth orienting structure 17, integrated first 18 and second 20 electrodes, and a catalyst spot 21. The first and second supports being separated by a gap 22, and an oscillatory resonating member 24, here comprising a suspended nanotube, arranged such that the nanotube originates from the catalyst spot, is oriented by the growth orienting structure, and bridges the gap between the first 18 and second 20 electrodes of the substrate 12 such that a portion 26 of the nanotube is left suspended over the gap. In addition the nanoresonator device further comprises at least one tuning control 27 in signal communication with the oscillatory member 24 for tuning the resonant frequency of the member, and an RF input 28 in signal communication with the oscillatory member for inducing an oscillation. The RF input can be capacitively coupled via input 28, or coupled by direct application across electrodes 18 and 20.

Figure 2:
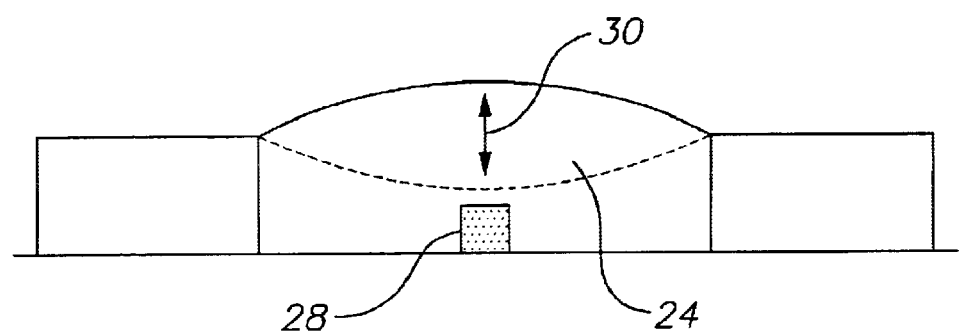
FIG. 2 is a schematic view of an embodiment of a suspended nanotube resonator in operation as an oscillator according to the invention.

Although a nanoresonator having a single nanotube rigidly fixed between two posts is shown in FIG. 1, it should be understood that any suitable nanoresonator capable of tuned oscillation may be utilized. Regardless of the design, the nanoresonator device shown schematically in FIG. 1 has two basic modes of operation: an oscillator mode, shown in FIG. 2 and a sensor mode shown in FIG. 3. As shown in FIG. 2, in the oscillator mode, the suspended nanotube 24 acts as a transducer, converting an input bias 28 into a mechanical oscillation 30. In this embodiment, two input voltages are used to control the frequency of the oscillation 30. First, because the tube length depends on injected charge, a bias from the tuning control source is capacitively coupled to the nanotube such that this bias can be used to control the stress on the rigidly anchored nanotube 24, thereby allowing for the tuning of the nanotube's mechanical resonance frequency. Second, an additional RF bias applied at input 28, or at one of the supporting electrodes 18 and 20, is then utilized to vary the length of the nanotube at the RF frequency, thereby producing an oscillating deflection of the suspended nanotube structure.

Figure 3:
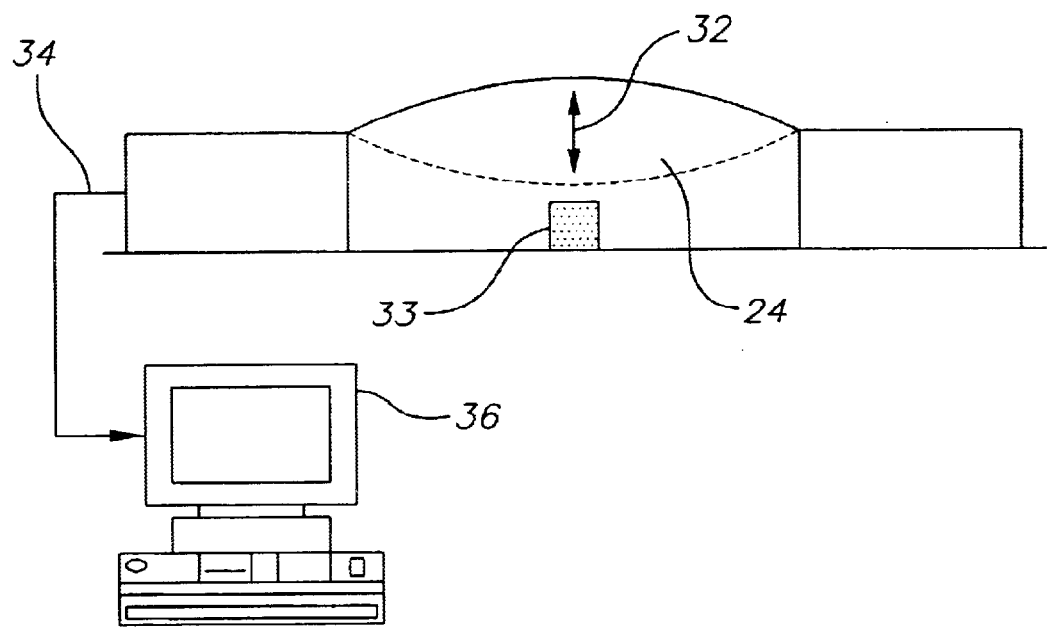
FIG. 3 is a schematic view of an embodiment of a suspended nanotube resonator in operation as a sensor according to the invention.

As shown in FIG. 3, when the suspended nanotube 10 is operated in the inverse mode, subtle changes in the position of the suspended nanotube, i.e., a deflection 32 cause by an impinging molecule or an RF signal 33 will induce a voltage across the suspended nanotube producing an output signal 34 which can be measured by an external monitoring device 36 in signal communication with the electrodes 18 and 20 of the nanotube 10. In addition, the suspended nanotube resonator can act as a molecular detector when operating as an oscillator by measuring shifts in the mechanical resonance frequency induced by attached molecules. Such a detector can be made to be chemically specific by functionalizing the nanotube to attach to specific molecules.

Figure 4:
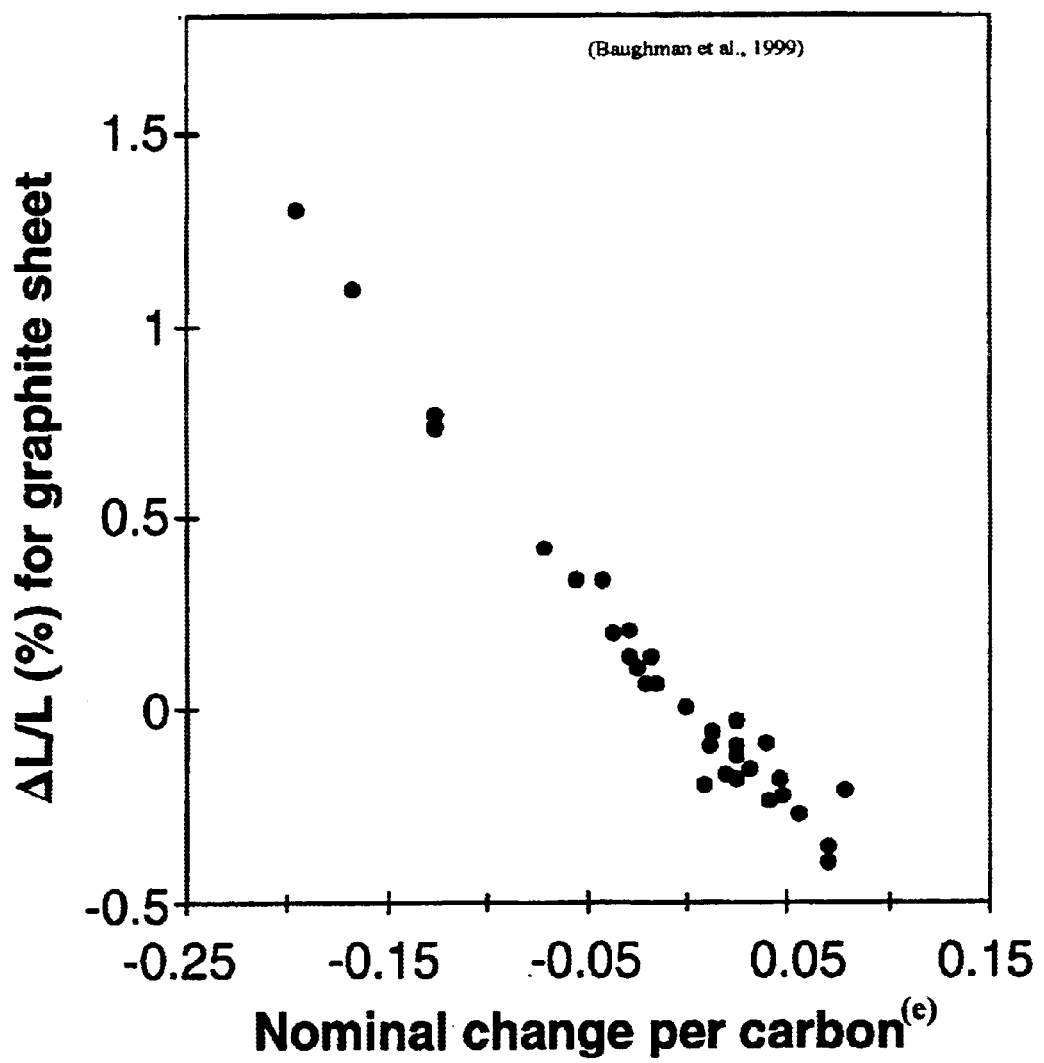
FIG. 4 is a graphical representation of the C—C bond length variation of carbon nanotubes.

The charge induced motion and motion induced charge discussed above have previously been observed in random arrays of carbon bimorph mats and in graphite sheets, see, e.g., R. Baughman, cited above, incorporated herein by reference. Data cited in this paper showing related results for graphite indicates the C—C bond length change versus charge variation given in FIG. 4. The graphite data is directly relevant to carbon nanotubes, because nanotubes are essentially "rolled up" graphite sheets. Although not to be bound by theory, it is believed that the nanotube length change is caused by "quantum chemical effects", that is, changes in orbital occupation and band structure result in changes in the C—C bond distances and thus the length of the nanotube. It should also be noted that the charge-induced transduction mechanism is symmetric, i.e., length changes in the nanotubes will induce charge transfers and hence voltages, providing a readout mechanism and/or positional sensor for both actuators and oscillators. Although the Baughman experiments were done in electrolytic solutions, it should be understood that no electrolytic solution is required so long as direct electrical contact is made with each nanotube. Alternatively, although the charge-induced actuation mechanisms shown in FIGS. 1 to 3 are only depicted in non-liquid environments, which are useful for high-Q resonator applications, it should be understood that the nanotube electromechanical transduction effect can be compatible with operation in liquids, such as for use in biological actuators.

Because the C—C bond length and therefore the overall tube length of the suspended nanotube depends on the injected charge, a capacitively coupled dc bias can be used to control the stress of the suspended tube. The graphite data cited by Baughman et al., as reproduced in FIG. 4 suggests that voltage biases of only a few volts can produce nanotube strains of approximately 1 percent. In the device depicted in FIGS. 1 to 3, in which both ends of the nanotube are rigidly anchored, controlling the charge injection varies the stress on the tube and provides a straightforward method for tuning the mechanical resonant frequency, on the tube.

Conversely, the oscillation of the nanotube will produce an oscillating voltage signal proportional to amplitude giving a direct readout of vibration. Because the oscillator displacement is $\pi/2$ out of phase with the applied force at resonance, a phase sensitive measurement technique can be utilized to extract resonance curves and stabilize on the mechanical resonant frequency. In addition, because the nanotube transverse mechanical resonant frequency scales as diameter/(length)$^2$, a range of nanotube lengths allows resonance frequencies to easily be varied over the entire UHF range.

Any nanofeature suitable for use as an actuator/oscillator suspended nanotube may be utilized in the current invention. In a preferred embodiment, as shown in FIGS. 1 to 3 and discussed above, a suspended carbon nanotube is utilized. Carbon nanotubes possess a combination of properties that make them well suited for use as nano-resonators. For example, nanotubes combine a nanometer scale diameter with a large aspect ratio, good electrical conductivity, and elastic bending. Single-wall nanotubes also have a Young's modulus of approximately 1 TPa, which corresponds to strength/weight ratio approaching 200 times that of steel. The combination of this high Young's modulus and the ability to withstand large strains (~5%) suggests that SWNTs should also have very high breaking strengths.

In addition, the natural rigidity and structural perfection of the nanotubes, discussed above, indicates that the suspended nanotube system according to the present invention should function as a high-Q mechanical resonator for many devices, such as, for example, filters, signal processors, and sensors. Since nanotubes naturally occur with nanoscale diameters, they are well suited for fabrication of oscillators with large aspect ratios and associated high responsivity. The lowest order resonant frequency for a nanotube cantilever is given by:

$$v_j = \frac{(1.875)^2}{8\pi} \frac{1}{L^2} \sqrt{D^2 + D_i^2} \sqrt{\frac{E_b}{\rho}} \quad (1)$$

where L is the length, D and $D_i$ are the outer and inner diameters, Eb is the elastic modulus, and is the density (1.33 g/cm$^3$). For a cantilever with D=10 nm, $D_i$=8 nm, and 100 nm in length, this formula predicts a resonant frequency of approximately 4 GHz. This frequency more than doubles for a nanotube oscillator fixed on both ends as proposed in the current invention. Note that since nanotube lengths can be varied over the range of approximately 10 nm to 100 µm, it is possible to control resonant frequencies over 8 orders of magnitude.

Such nano-structures also exhibit extremely high quality factors, for example, Q values of mechanical oscillators range from $10^3$ to $10^9$, with values of $10^3$ to $10^5$ for nanoscale structures in vacuum. These Qs are much larger than typical quality factors for electronic resonant circuits, accordingly, mechanical resonators such as quartz crystal oscillators are used in communications systems. Because Q varies as 1/D, where D is the internal dissipation, high Q values correspond to low-loss system components. High quality factors also translate to exceptional oscillator stability and low phase noise. Such low-phase-noise local oscillators (LO) are critically important for narrow-bandwidth communications and sensitive doppler radars. For example, the LO phase noise sets the minimum detectable velocity for Doppler radar. In another embodiment, such high-Q oscillators could also be utilized as narrow-band, low-loss filters, and improve the stability and sensitivity of MEMS-based sensors such as a micro-gyroscope.

Moreover, by moving to nanoscale mechanical structures, it is possible to combine high Qs with high frequency operation and small force constants (high responsivity). Calculations indicate that Si mechanical oscillators with realistically achievable dimensions (0.1×0.01×0.01) have resonant frequencies of a few GHz. High resonant frequencies are important for producing mechanical signal processing components compatible with today's characteristic circuit clock rates. Resonators with nanoscale dimensions can achieve GHz resonant frequencies in structures with reasonably large aspect ratios, which translates directly to small force constants. The combination of high-Q with small force constants enabled by nanoscale resonators results in oscillators with exceptional force sensitivity. Accordingly, in one embodiment the nano-resonator may be utilized in the inverse mode for a variety of force-detection-based sensors.

In general, excitation and readout of a suspended nanotube oscillator could be done using the actuation methods previously discussed: charge-induced transduction, light, or electrostatic.

The signal monitor system for any of the above detection schemes can comprise any suitable circuit or device capable of measuring the signal change from the detector and transmitting that information to the user, such as, for example, a printed circuit board having a pre-amplifier, an AD converter and driver circuit, and a programmable chip for instrumentation specific software; or a multichip module comprising those elements.

In another embodiment, the nanoscale oscillators discussed above may also be utilized in mechanical signal processing systems. Mechanical signal processing is of great interest because small-scale, high-Q mechanical elements theoretically enable processing at GHz rates with up to six orders of magnitude lower power dissipation than conventional CMOS processors of comparable complexity. In addition, such devices would be radiation tolerant, an important property for space-based applications. For example, an oscillator array according to the invention containing elements with controllably varying resonant frequencies could be utilized for high-speed Fourier signal processing, mimicking the mechanical processing that occurs in mammalian ears.

Although as discussed above, an oscillator geometry comprising a suspended nanotube resonator with electrical contacts to both ends of the nanotube is preferred, any suspended nanotube structures with an RF source capable of initiating an oscillation on the nanotube may be utilized. For example, systematic variations of critical geometric factors may include the nanotube lengths and electrode attachment. Moreover, while the embodiments shown thus far described a single nanotube rigidly attached at two ends, the present invention could also function as an effective oscillator using multiple tubes grown on a single electrode, such as in a cantilever design. Alternatively, oscillators and force sensors with more than two electrodes are also possible. For example, any spacing or pattern of nanotubes and electrodes may be utilized such that at least a portion of the nanotube is free to vibrate, as shown in FIGS. 2 and 3, and such that the resonant frequency of the vibratable portion of the nanotube is tunable.

Returning to the structure of the underlying suspended nanotube system 10, shown in FIGS. 1 to 3, it should be understood that the substrate 12 can be made of any material which can withstand the temperatures required for growth of the nanotube 24 and which can be modified to provide a suitable nucleation point for orienting and growing the nanotube 24 between the two posts 14 and 16 of the nanomechanical device 10, such as, for example, metallized Si oxide wafers, alumina, or sapphire. In turn, any suitable electrode and catalyzing metal can be used for the electrodes 18 and 20 and to activate the nucleation point 17 on the surface of the substrate 12, such as, for example, nickel or cobalt. Alternatively, the catalyzing metal could be an alloy of two or more metals such as a Co/Ni or Ti/Ni alloy. The metal catalysts could also be produced by pyrolysis of inorganic or organic metal-containing compounds, such as, for example, Ferric Nitrate or Cobalt Chloride. Accordingly, in the limit of sub-50 nm catalyst dots, it is possible to nucleate growth of a single nanotube 24 at a catalyst location. Integrated electrodes 18 and 20 can be produced by combining the catalyst dots with non-catalytic electrodes. This ability to precisely locate and orient the growth of an individual nanotube and make electrical contact to the two ends of the tube provides the basis for fabrication of the suspended nanotube oscillator structure. Such a method may utilize an electron-beam lithography system.

Figure 5:
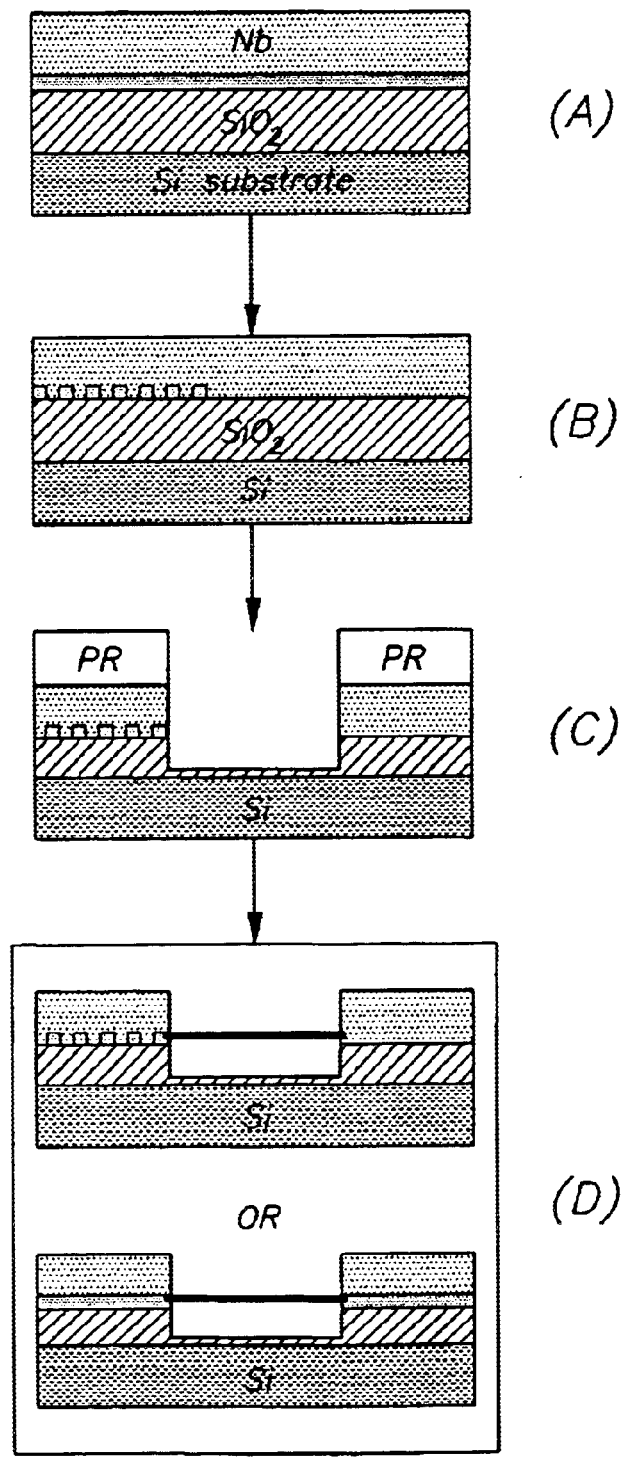
FIG. 5 is a schematic view of an embodiment of a process for forming a suspended nanotube resonator according to the invention.
Figure 6A:
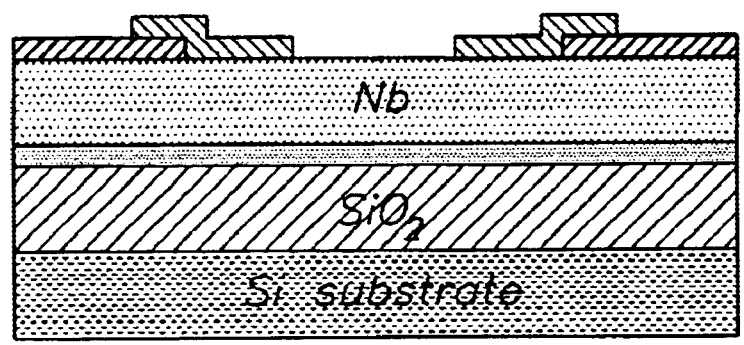
FIG. 6a is a schematic view of an embodiment of a process for forming the electrodes for a suspended nanotube resonator according to the invention.
Figure 6B:
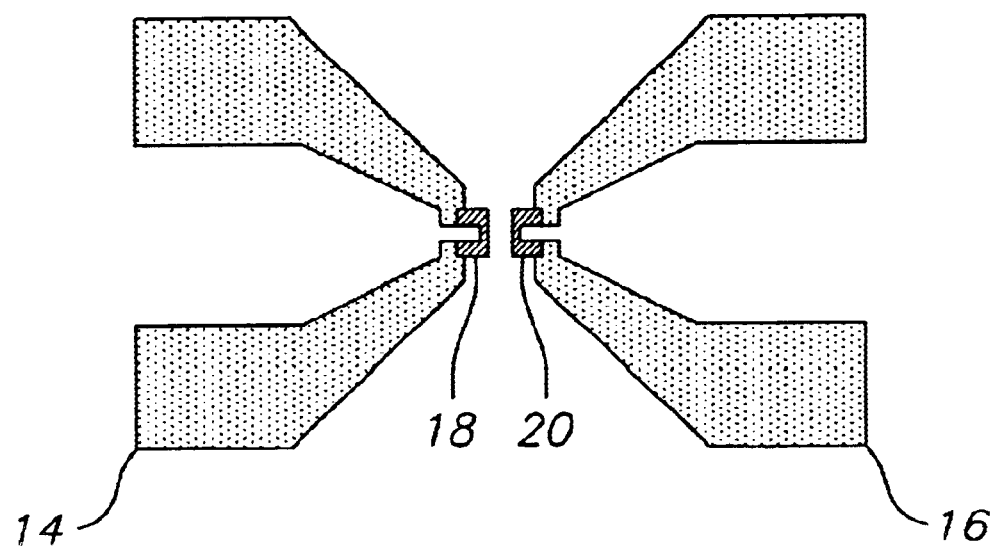
FIG. 6b is a schematic view of an embodiment of the electrodes according to the invention.
Figure 7:
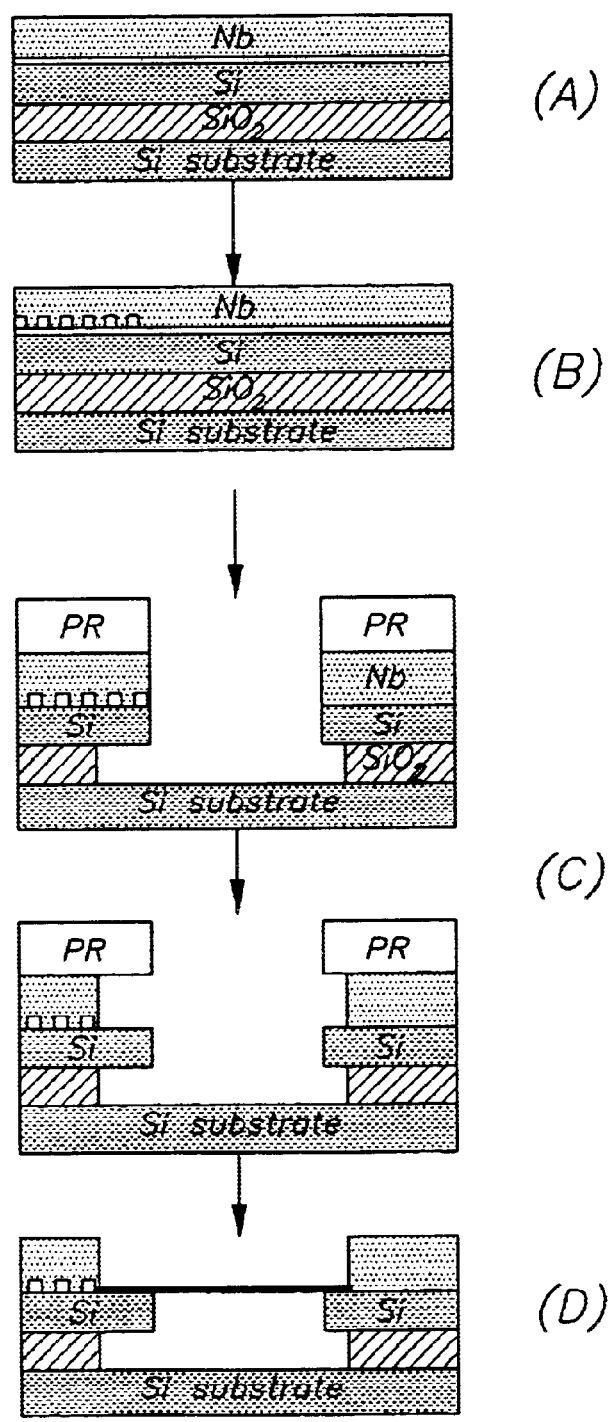
FIG. 7 is a schematic view of an alternative embodiment of a process for forming a suspended nanotube resonator according to the invention.

This patent is also directed to a novel "pattern-aligned" growth process for orienting the growth of the nanotube between the posts. Two alternative processes for forming the nanomechanical device of the present invention comprising a suspended nanotube resonator utilizing a chemical vapor deposition (CVD) technique are shown schematically in FIGS. 5 to 7. In a first method, as shown in FIGS. 5 to 7, the in-plane nanotube growth is controlled by pre-patterning nanotube alignment structures into Si or Si-on-Insulator (SOI) wafers.

The basic technique to construct the alignment structures, such as the in-plane pointed silicon cantilevers shown in FIG. 1, uses standard semiconductor processing methods to construct a protruding cantilever from an undercut SOI layer on a Si substrate. To ensure proper growth the region of the cantilevers is coated with a thin catalyst film such as Ni, Co, or other metal-based mixtures or compounds to locally nucleate nanotube growth. The entire material is capped with a refractory metal such as sputter Nb for protection.

As shown in one basic embodiment, (FIG. 5), a trilayer Si/SOI/Nb starting material is deposited utilizing a standard CVD method. A catalyst layer may be sputtered on top of the SOI layer at this point in either an undifferentiated layer followed by a liftoff step to pattern the catalyst (Step A); or the catalyst may be deposited in a pattern prior to the deposition of the cap layer using a suitable controlled method, such as BCP, photolithographic/ebeam, or annealing (Step B). The trilayer is then etched via a suitable etching technique (an RIE or wet etch for the Nb; a wet or dry etch for the catalyst; a dry or HF etch for the SOI) to define the post, or electrodes. (Step C) Once the necessary support structures are constructed, the nanotubes are grown via self-assembly to bridge the gap between the two supports. (Step D). A process similar to this is described in detail in a paper by Han et al., J Appl. Phys. 90(11), 5731 (2001), which is incorporated herein by reference.

Although one method of forming the electrode supports is described above, in an alternative method shown in FIGS. 6a and 6b, a combined optical and ebeam process is utilized to construct the electrode contacts. As shown in FIG. 6a, a structure of Ti/Pt is deposited prior to etching the trilayer material. This Ti/Pt structure serves as a mask for the dry etch of the Nb such that the Ti/Pt electrode structure remains in place after the etch to form two electrodes, as shown in FIG. 6b.

An alternative method for forming the support structures for the current invention is shown in FIG. 7. As shown, this method uses a quad-layer material of Si/SOI/Si with a Nb cap layer. As before, the catalyst can be deposited and then lifted off to form a pattern, or deposited in a patterned geometry before capping the material. The only significant difference in the two techniques is the material the cantilever is made of and that in the method shown in FIG. 7, true undercutting of the cantilever is performed. (Step C).

Regardless of the method utilized to form the supports and electrodes, a chemical vapor deposition process (CVD) is utilized to grow the nanotubes from the catalyst patterns. In one embodiment, the CVD process uses methane, ethylene, or carbon monoxide in pure form or in a mixture with hydrogen (or ammonia) and argon (or nitrogen) to produce nanotubes on a substrate heated to approximately 500–1000 C. (FIGS. 5 and 7: Step D)

Figure 8:
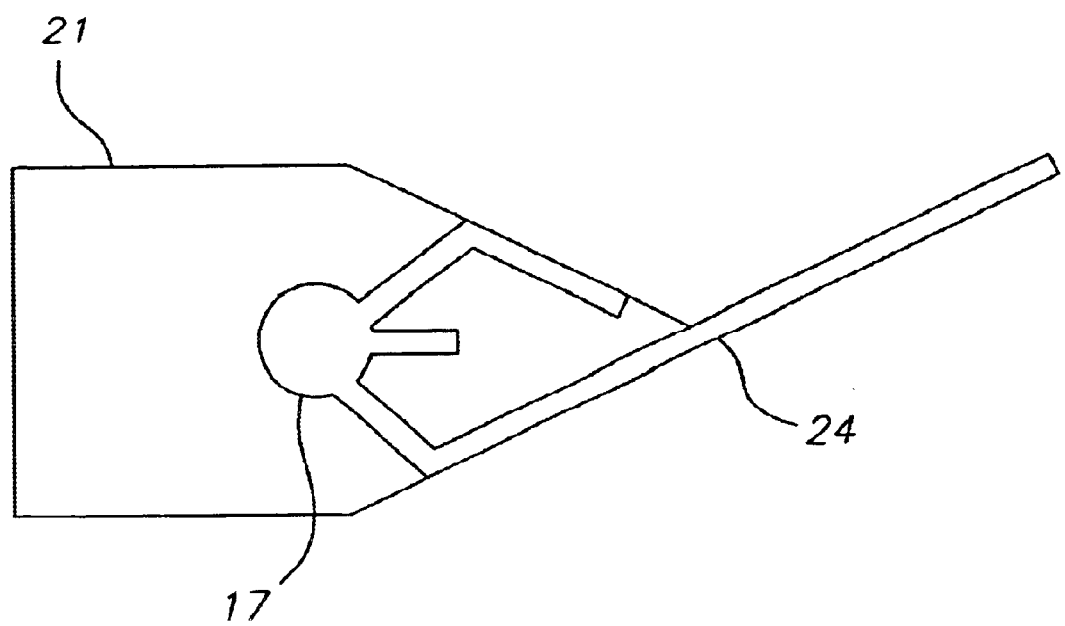
FIG. 8 is a top schematic view of an embodiment of a process for orienting a suspended nanotube resonator according to the invention.
Figure 9:
FIG. 9 is an SEM of the aligned growth of a carbon nanotube from the tip of an AFM. (J. Hafner, C. Cheung, C. Lieber, J. Am. Chem. Soc. 121, 9750 (1999).

In conventional techniques, the nanotubes grown using such techniques tend to nucleate at random times and locations at the catalyst so that multiple tubes may grow out of the catalyst island. The key to the current technique is incorporation of a growth aligning structure into the construction of the nanotube support. As illustrated in FIG. 8, growing nanotubes tend to grow along the patterned cantilever surface or edges due to attractive van der Waals forces. However, when a growing tube reaches a sharp discontinuity, or tip, it has a high probability of protruding because the strain energy cost of bending around the small-radius tip exceeds the van der Walls attraction. FIG. 9 shows a scanning electron microscope (SEM) image of the oriented growth of a carbon nanotube away from the tip of an AFM. (J. Hafner, C. Cheung, C. Lieber, J. Am. Chem. Soc. 121, 9750 (1999)).

Figure 10A:
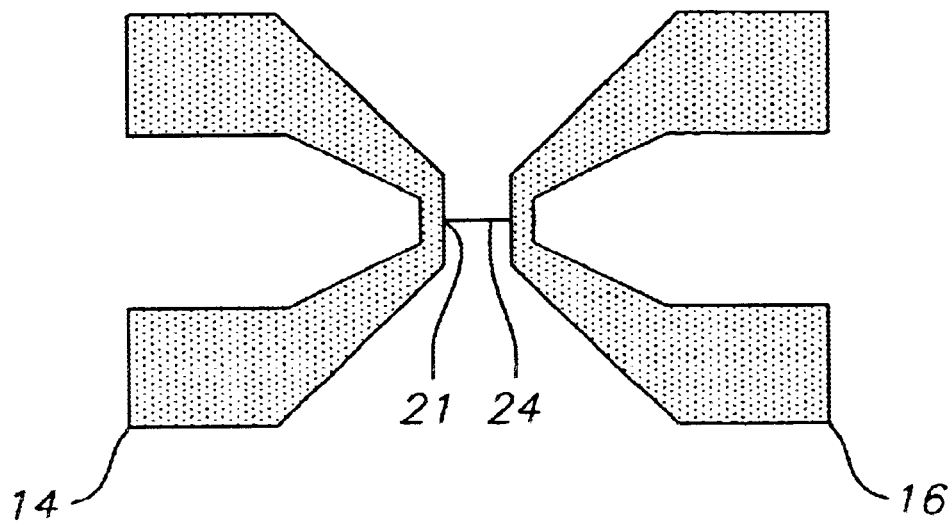
FIG. 10a is a top schematic view of an embodiment of the electrode and supporting structure for a suspended nanotube resonator according to the invention.
Figure 10B:
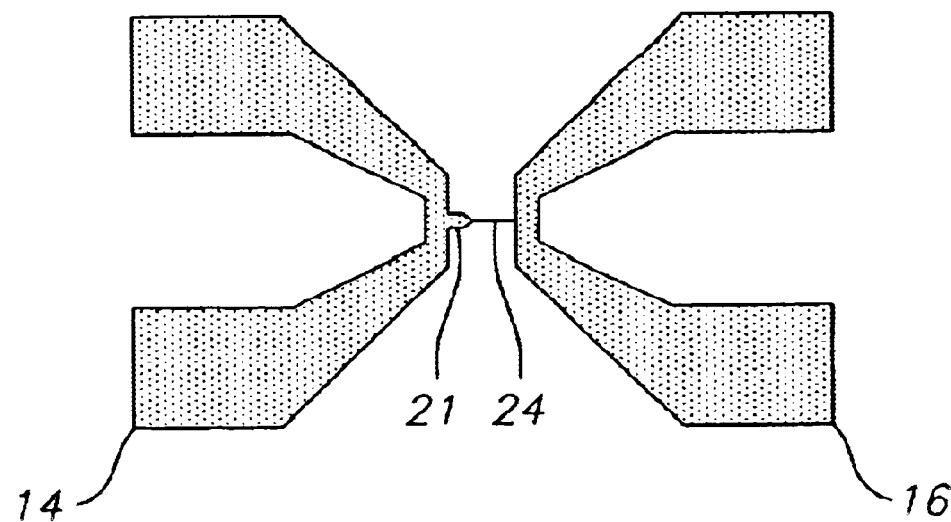
FIG. 10b is a top schematic view of an alternative embodiment of the electrode and supporting structure for a suspended nanotube resonator according to the invention.

Note that although the embodiment of the invention shown in FIG. 8, and discussed above has simple edges, in an alternative embodiment, this invention could include further patterns along the edges of the cantilever to direct some growing nanotubes away from the cantilever tip. This process could be utilized to ensure that only a single nanotube protrudes from the end of the cantilever. In addition, any alternative cantilever design could be utilized such that the necessary energy required to reorient the carbon nanotube at the cantilever's tip would be sufficient to overcome the van der Waals force at the edges. Examples of some alternative cantilever designs are shown schematically in FIGS. 10a and 10b.

Further, although only cantilever pattern-aligned growth methods are discussed above, it should be understood that any structure suitable for orienting the growth of carbon nanotubes could be utilized. For example, in another alternate process, narrow etched trenches in Si wafers could be utilized to preferentially align growing nanotubes due to enhanced van der Waals at the trench edges.

In yet another process electric fields could be utilized to align the growth of the carbon nanotubes. In this case, the process would use pointed cantilever structures similar to those described above, but with integrated electrodes. A bias applied during growth would result in high local electric fields near the tip, which would align the nanotube growth between the cantilever end and an on-chip electrode located nearby. In such an embodiment, the bias circuitry would be designed to avoid destruction of the nanotubes as the electrode gap is bridged by the growing tube (e.g., by incorporating a large series resistor in the circuit). It will be understood that his technique may require adjusting the pressure and/or electrode spacing to avoid striking a discharge between the biased electrodes. Note that there has been a recent demonstration of electric-field-aligned nanotube growth between parallel linear electrodes (Y. Zhang et al., Applied Physics Letters 79, 3155 (2001)). However, in this case nucleation and growth of the nanotubes along the electrodes occurred at random locations and there were no orientation structures to confine the nanotubes to particular locations.

Although these processes are only discussed for use in directing the growth of a nanotubes off the end of microfabricated cantilever to produce suspended nanotube bridges for application to a tunable nanotube resonator, this inventive alignment process could enable the fabrication of other nanotube-based devices which require alignment, such as transistors and memory elements.

Further, although one method for the self-assembly of carbon nanotubes is described above, it should be understood that in order to incorporate the carbon nanotube oscillators on CMOS electronics it is necessary to provide carbon nanotube growth at temperatures compatible with processed CMOS circuits, i.e., below about 500° C. Although any suitable method of low temperature growth may be utilized, some exemplary methods include: 1) Murikami et al. (*Appl. Phys. Lett.* 76(13), 1776 (2000)) method for growing aligned carbon nanotube arrays for field emission at <600° C. using bias-enhanced microwave plasma CVD on patterned, nickel-based catalyst at 1–3 Torr; 2) Li et al. (*Appl. Phys. Lett.,* 79(11), 1670 (2001)) method of unaligned nanotube growth on glass at 570° C. using CVD at 100 Torr; 3) low temperature processes for growing carbon nanotubes on silicon (Choi et al.,*J. Vac. Sci. Technol. A,* 18(4), 1864 (2000)): using 70 nm nickel films as a catalyst deposited on silicon substrates coated with TiN as an adhesion enhancement layer) and silicon dioxide (Lee et al., *Chem. Phys. Lett.* 327, 277 (2000)) between 500–550° C.; 4) Zhang and Iijima (*Appl. Phys. Lett.,* 75(20), 3087 (1999)) method for growing single-walled carbon nanotubes at 400 C using laser ablation technique with powdered catalyst containing Ni—Co; and 5) Chen et al. (*J. Cryst. Growth,* 193, 342 (1998)) method of growing graphitic nanofibers on nickel substrates at 350–400° C. All of which are incorporated herein by reference.

While the self-assembled suspended nanotube resonators contemplated in the embodiments discussed so far have been constructed of suspended carbon nanotube resonators made from pyrolizing an ethylene feedstock over a substrate having an ordered array of nucleation points, the resonators can be of any shape and made by any process and from any material suitable for making self-assembled tunable suspended resonators, such as, for example, spheres or pyramids made of other atomic materials or even biomolecules, such as, for example, proteins. In another embodiment, the resonators are further functionalized for a variety of applications, such as, for example, being made hydrophilic or hydrophobic, being charged either negatively or positively, or being derivatized with specific chemical groups, etc. In addition, although only an untreated carbon nanotube nanomechanical device have been shown thus far, in situ sidewall treatments could alter the electrical properties of the nanotube, such as by increasing the charge differential induced by a given applied voltage.

Finally, although the above discussion has focussed on the construction and structure of the suspended nanotube resonators, it should be understood that a nanomechanical device according to the invention may also include a body, a self-contained power supply, and any additional machinery or circuitry necessary for the device's operation. For example, the body of the nanomechanical device itself can be made of any material suitable for micromachining utilizing standard lithographic or MEMS techniques to enclose the suspended nanotube resonator, such as, for example, aluminum oxide or silicon. In a preferred embodiment, the body further comprises a cap layer, which can be of any design, such that the cap layer protects the suspended nanotube resonator from unwanted contact with the external environment. Such a cap layer could be made of any suitable material, such as, for example, aluminum oxide or silicon. Such a cap layer could be formed by any conventional MEMS process, such as growth or deposition over a sacrificial layer (not shown) deposited to encapsulate the self-assembled suspended nanotube resonator wherein the sacrificial layer can subsequently be removed to expose the self-assembled suspended nanotube resonator itself. Alternatively, these support structures could be formed in a single deposition step with the self-assembled suspended nanotube resonator. In a more preferred embodiment, one of the substrate, the cap layer, or walls of the nanomechanical device is transparent such that an optical source can be used to interrogate or activate the suspended nanotube resonator.

Figure 11:
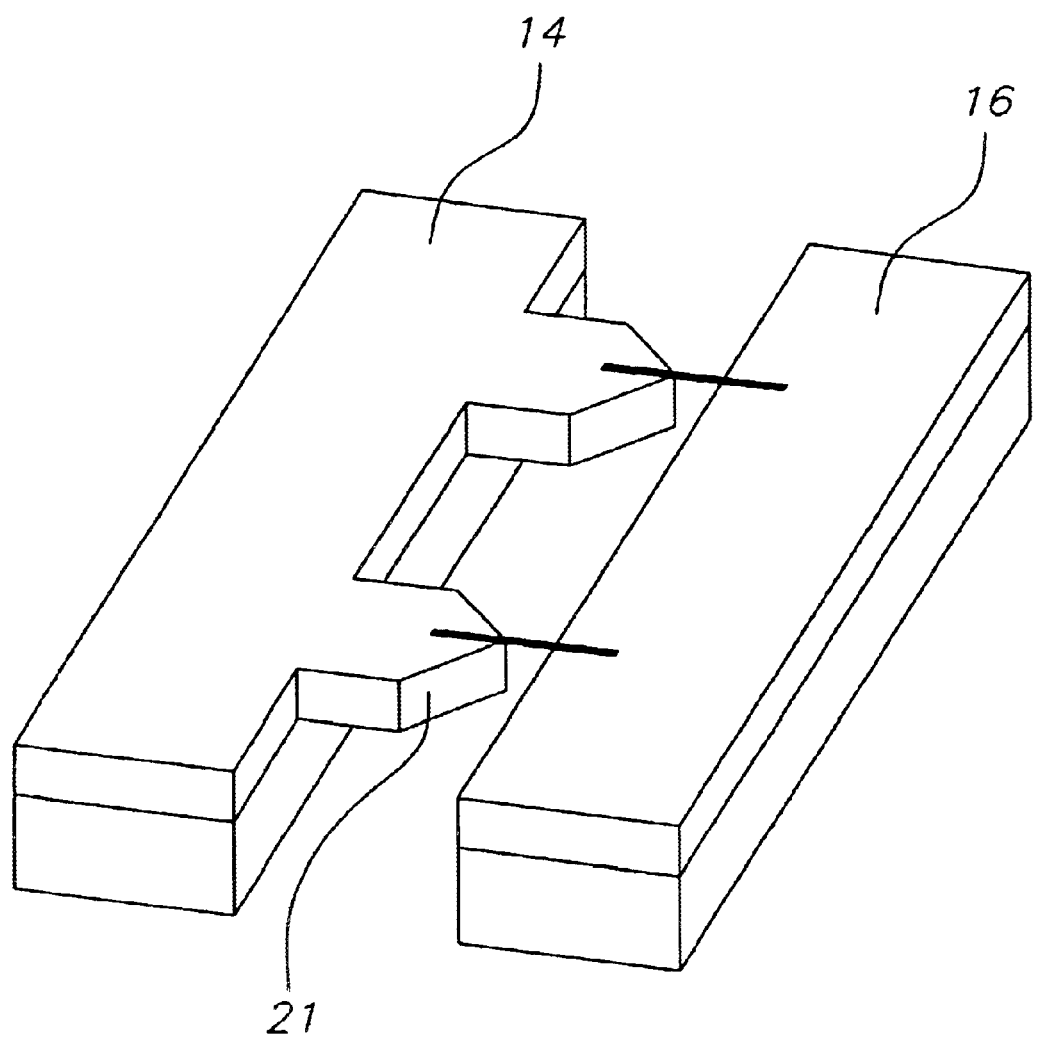
FIG. 11 is a schematic view of an embodiment of a pair of suspended nanotube resonators according to the invention.
Figure 12:
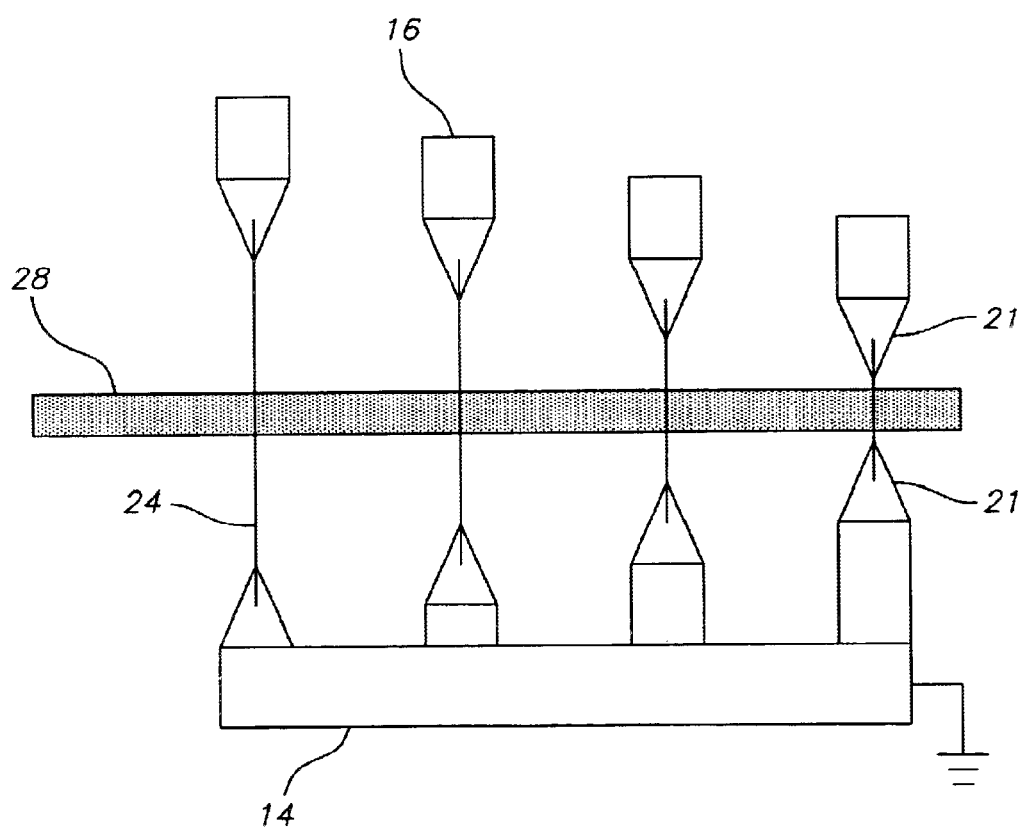
FIG. 12 is a schematic view of an embodiment of an array of suspended nanotube resonators according to the invention.

In another alternative embodiment, as shown schematically in FIGS. 11 and 12, the nanomechanical device may comprise an array of multiple suspended nanotube resonators aligned on a single substrate, and of either a single uniform length (FIG. 11) or of variable lengths (FIG. 12) such that multiple or parallel processing can be carried out at one time. In this embodiment, the suspended nanotube resonators can be integrated into a single circuit or detector, such as a fast RF spectrum analyzer. It should be understood that while arrays of suspended nanotube resonators are discussed above, any suitable alternative geometry of suspended nanotube resonators may be utilized. Such an embodiment could be used to develop a mobile suspended nanotube resonator detector device on a chip for mobile detection and analysis of samples. In such an embodiment a portable power source (not shown) would also be integrated into the device.

Further, although the above discussion has been directed to the actual suspended nanotube resonator according to the present invention, it should be understood that the invention is also directed to suitable nanomechanical devices comprising the nanoresonators shown schematically in the above figures.

Although specific embodiments are disclosed herein, it is expected that persons skilled in the art can and will design alternative nanomechanical devices and methods to produce the nanomechanical devices that are within the scope of the following claims either literally or under the Doctrine of Equivalents.

What is claimed is:

1. A tunable nanoresonator comprising:
    a support structure;
    a tuning power source for producing a tuning bias;
    an RF signal power device comprising at least one of an RF bias emitter and a bias detector; and
    at least one resonating member, wherein at least one portion of the resonating member is fixedly attached to the support structure and at least one portion of the member is free to oscillate at a resonant frequency, the resonating member in signal communication with the tuning power source such that a tuning bias applied to the resonating member alters the resonant frequency of the resonating member, the resonating member in further signal communication with the signal power device such that an RF bias applied to the resonating member by the RF signal power device induces an oscillatory motion in the resonating member and such that oscillatory motion of the resonating member induces a voltage or current measurable by the RF signal power device.

2. The tunable nanoresonator according to claim 1 wherein the support structure is made of a material selected from the group consisting of silicon, alumina, glass, sapphire or quartz.

3. The tunable nanoresonator according to claim 2 wherein the support structure further comprises a plurality of electrodes sufficient such that the resonating member is fixedly attached to the support structure through an electrode, wherein the electrodes are in signal communication with the RF signal power device and wherein the resonating member is in signal communication with the RF signal power device through the electrode.

4. The tunable nanoresonator according to claim 3 wherein the electrodes are made of a metal selected from the group consisting of gold, platinum and titanium.

5. The tunable nanoresonator according to claim 1 wherein the resonating member is fixedly attached to the support structure at two points.

6. The tunable nanoresonator according to claim 1 wherein the support structure further comprises a plurality of catalytic spots deposited thereon wherein the resonating member is fixedly attached to the support structure through a catalytic spot.

7. The tunable nanoresonator according to claim 6 wherein the catalytic material is selected from the group consisting of Fe, Ti, Ni, Co, Mo, Ni/Co alloy, and Ni/Ti alloy.

8. The tunable nanoresonator according to claim 2, wherein the tuning power source is selected from the group consisting of: a light source, a voltage source, a current source, and a magnetomotive source.

9. The tunable nanoresonator according to claim 1 wherein the RF signal power device is a voltage detector.

10. The tunable nanoresonator according to claim 1 wherein the resonating member has a cross-sectional dimension of about 1 to 100 nm.

11. The tunable nanoresonator according to claim 1 comprising at least two support structures wherein the space between the support structures has a dimension of about 10 to 200 nm.

12. The tunable nanoresonator according to claim 1 wherein the device operates as one of an oscillator and a sensor.

13. The tunable nanoresonator according to claim 1 wherein the nanoresonator comprises at least two support structures and wherein the resonating member is attached at either end to one of the at least two support structures.

14. The tunable nanoresonator according to claim 1 wherein the device is an oscillator selected from the group consisting of: an RF filter, a signal processor, and a microgyroscope.

15. The tunable nanoresonator according to claim 1 wherein the device is one of either a force-based sensor and an RF frequency sensor.

16. The tunable nanoresonator according to claim 1 comprising a plurality of resonating members of varying lengths.

17. The tunable nanoresonator according to claim 1 wherein the resonating member is made of carbon.

18. The tunable nanoresonator according to claim 1 wherein the resonating member is grown by self-assembly on the support structure.

19. The tunable nanoresonator according to claim 1 wherein the resonating member is one of either a nanotube or a nanorod.

20. The tunable nanoresonator according to claim 1 wherein the resonating member is chemically or biologically functionalized.

21. The tunable nanoresonator according to claim 1 wherein the outer surface of the resonating member is treated to increase the resistance of the resonating member.

22. The tunable nanoresonator according to claim 1, further comprising a device body defining an internal volume wherein the resonating member is confined within the internal volume.

23. The tunable nanoresonator according to claim 22, wherein one of the substrate or device body is transparent.

24. The tunable nanoresonator according to claim 22 wherein the device body is made of a material selected from the group consisting of silicon, alumina, glass, sapphire, and quartz.

25. The tunable nanoresonator according to claim 1 wherein the RF induced motion of the resonating member is proportional to the RF bias applied to the resonating member.

26. The tunable nanoresonator according to claim 1 wherein the motion induced voltage or current of the resonating member is proportional to the degree of motion of the resonating member.

27. The tunable nanoresonator according to claim 1 wherein the device is disposed in a liquid environment.

28. The tunable nanoresonator according to claim 1 wherein the device is disposed in a vacuum environment.

29. The tunable nanoresonator according to claim 1 wherein the device is disposed in a gaseous environment.

30. The tunable nanoresonator according to claim 1 comprising at least two resonating members wherein at least one of the resonating members is operated as a sensor and at least one of the resonating members is operated as an oscillator.

31. The tunable nanoresonator according to claim 1 comprising at least two resonating members wherein the resonating members are operated as sensors, wherein each sensor is designed to detect a different substance.

32. The tunable nanoresonator according to claim 1 comprising at least two resonating members wherein the resonating members are operated as sensors, wherein all the sensors are designed to detect a single substance.

33. The tunable nanoresonator according to claim 1 comprising at least two resonating members wherein the resonating members are operated as oscillators, wherein the oscillators are designed with different resonant frequencies.

34. The tunable nanoresonator according to claim 1 wherein the support structure defines a substrate, and wherein the substrate further comprises a depressed portion, and where the resonating member is formed over the depressed portion in the plane defined by the substrate.

35. The tunable nanoresonator according to claim 1 wherein the support structure has an area of about 1 $mm^2$ to 1 $cm^2$.

36. A tunable nanoresonator comprising:
at least two support structures;
a tuning power source for producing a tuning bias;
an RF signal power device comprising at least one of an RF bias emitter and a bias detector; and at least one resonating carbon nanotube member, wherein both ends of the carbon nanotube member are fixedly attached to one of the at least two support structures and at least one portion of the member is suspended such that the portion is free to oscillate at a resonant frequency, the resonating member in signal communication with the tuning power source such that a tuning bias applied to the resonating member alters the resonant frequency of the resonating member, the resonating member in further signal communication with the signal, power device such that an RF bias applied to the resonating member by the RF signal power device induces an oscillatory motion in the resonating member and such that oscillatory motion of the resonating member induces a voltage or current measurable by the RF signal power device.

37. A tunable nanoresonator comprising:

at least two support structures;

a tuning power source for producing a tuning bias;

a bias detector; and at least two resonating carbon nanotube members, wherein both ends of the at least two carbon nanotube members are fixedly attached to at least one of the at least two support structures and at least one portion of the member is suspended such that the portion is free to oscillate at a resonant frequency, the resonating member in signal communication with the tuning power source such that a tuning bias applied to the resonating member alters the resonant frequency of the resonating member, the resonating member in further signal communication with the bias detector such that an RF bias applied to the resonating member induces an oscillatory motion in the resonating member and such that oscillatory motion of the resonating member induces a voltage or current measurable by the bias detector.

38. A method of analyzing an frequency signal comprising the steps of:

providing at least one nanoresonator including a support structure, a tuning power source for producing a tuning bias, a bias detector, and at least one resonating member, wherein at least one portion of the resonating member is fixedly attached to the support structure and at least one portion of the member is free to oscillate at a resonant frequency, the resonating member in signal communication with the tuning power source such that a tuning bias applied to the resonating member alters the resonant frequency of the resonating member, the resonating member in further signal communication with the bias detector such that oscillatory motion of the resonating member induces a voltage or current measurable by the bias detector;

placing the nanoresonator into proximity of the frequency signal such that if the frequency of the frequency signal matches the resonant frequency of the resonating member the resonating member will undergo oscillatory motion; and measuring the potential on the resonating member and communicating the potential to user.

39. The method according to claim 38 wherein the potential is proportional to the motion of the nanoresonator.

40. The method according to claim 38 wherein the resonating member is a nanotube.

41. The method according to claim 40 wherein the method comprises providing at least two resonating members having different resonant frequencies.

* * * * *